United States Patent [19]

Wadsworth et al.

[11] Patent Number: 5,543,641
[45] Date of Patent: Aug. 6, 1996

[54] HYBRID SIGNAL CONDITIONING/INFARED IMAGING STRUCTURE

[75] Inventors: Mark V. Wadsworth, Richardson; Sebastian R. Borrello; Roland W. Gooch, both of Dallas, all of Tex.

[73] Assignee: Texas Instruments Incorporated, Dallas, Tex.

[21] Appl. No.: 471,897

[22] Filed: Jun. 7, 1995

Related U.S. Application Data

[62] Division of Ser. No. 175,876, Dec. 30, 1993, Pat. No. 5,449,908.

[51] Int. Cl.$^6$ ............... H01L 27/148; H01L 29/768
[52] U.S. Cl. ............. 257/226; 257/228; 257/236; 257/239; 257/241; 257/249
[58] Field of Search ............. 257/226, 228, 257/236, 239, 241, 249

[56] References Cited

U.S. PATENT DOCUMENTS

| | | | |
|---|---|---|---|
| 3,979,604 | 9/1976 | Bate | 307/221 D |
| 4,093,957 | 6/1978 | King et al. | 257/226 |
| 4,196,508 | 4/1980 | Lorenze, Jr. | 257/226 |
| 4,197,469 | 4/1980 | Cheung | 257/226 |
| 4,229,752 | 10/1980 | Hynecek | 357/24 |
| 4,369,458 | 1/1983 | Thomas et al. | 257/226 |
| 4,377,904 | 3/1983 | Chapman et al. | 29/578 |
| 4,467,340 | 8/1984 | Rode et al. | 257/226 |
| 4,684,812 | 8/1987 | Tew et al. | 250/578 |
| 4,686,373 | 8/1987 | Tew et al. | 250/578 |
| 4,720,738 | 1/1988 | Simmons | 357/30 |
| 4,779,004 | 10/1988 | Tew et al. | 250/578 |
| 4,968,886 | 11/1990 | Wan et al. | 250/332 |
| 5,274,263 | 12/1993 | Wadsworth | 257/409 |

FOREIGN PATENT DOCUMENTS

| | | | |
|---|---|---|---|
| 63-308970 | 12/1988 | Japan | 257/226 |
| 2-116168 | 4/1990 | Japan | 257/226 |
| 2-203562 | 8/1990 | Japan | 257/226 |
| 2-203563 | 8/1990 | Japan | 257/226 |
| 2113467 | 8/1983 | United Kingdom | 257/226 |

OTHER PUBLICATIONS

R. A. Chapman, et al., "$Hg_{0.7}Cd_{0.3}Te$ Charge–Coupled Device Shift Registers," *Appl. Phys. Lett.*, vol. 32, No. 7, 1978, pp. 434–436.

R. A. Chapman, et al., "Monolithic HgCdTe Charge Transfer Device Infrared Imaging Arrays," *IEEE Trans. Elect. Dev.*, vol. ED-27, No. 1, Jan. 1980, pp. 134–145.

M. V. Wadsworth, et al., "Monolithic CCD Time–Delay–and –Integrate Arrays in HgCdTe," *IEDM Tech. Dig.*, Dec. 1993, pp. 179–182.

T. L. Koch, et al., "Monolithic n–Channel HgCdTe Linear Imaging Arrays," *IEEE Trans. Elect. Dev.*, vol. ED-32, No. 8, Aug., 1985, pp. 1592–1598.

P. Horowitz, et al., "The Art of Electronics", *Cambridge University Press*, Cambridge, 1980, pp. 121–122.

W. Kosonocky, "Charge–Coupled Devices—An Overview," *1974 Western Electron. Show and Conv. Tech. Papers*, Vol. 18, Sep. 10–13, 1974, pp. 28–47.

R. Melen, et al., "Charge–Coupled Devices: Technology and Applications," *IEEE Press, Selected Reprint Series, IEEE Solid–State Circuits Council*, 1977, pp. 129–159.

(List continued on next page.)

*Primary Examiner*—Ngân V. Ngô
*Attorney, Agent, or Firm*—Brian A. Carlson; Richard A. Stoltz; Richard A. Donaldson

[57] ABSTRACT

A preferred embodiment of this invention is a hybrid semiconductor imaging structure comprising a high speed signal conditioning substrate (e.g. Si 12) and an imaging substrate (e.g. HgCdTe 10) mounted on the conditioning substrate using an adhesive layer (e.g. epoxy 31). Infrared-sensitive time delay and integration CCD columns (14) charge coupled to sense nodes (e.g. diodes 16) are disposed in the imaging substrate. High speed signal processing channels (e.g. capacitive transimpedance amplifier 18, congelated double sampling circuit 20 and multiplexing shift register 22) are disposed in the conditioning substrate. The sense nodes are connected to the signal processing channels with low capacitance hybrid leads (e.g AI 17).

18 Claims, 2 Drawing Sheets

OTHER PUBLICATIONS

R. Keyes, Ed., "Optical and Infrared Detector, 2nd Ed.", *Springer–Verlag,* Berlin New York, 1980, pp. 197, 228.

M. Wadsworth, et al., "Field–Extended Field–Effect Transistors in 0.25–eV Bandgap HgCdTe," *IEEE Transactions on Electron Devices,* vol. 40, No. 3, Mar. 1993, pp. 487–492.

W. Grant, et al., "Integrated CCD–Bipolar Structure for Focal Plane Processing of IR Signals," *1975 International Conference on the Application of Charge–Coupled Devices,* San Diego, Calif., US (29–31 Oct. 1975) pp. 53–58.

HYBRID SIGNAL CONDITIONING/INFARED IMAGING STRUCTURE

This is a divisional of application Ser. No. 08/175,876 filed Dec. 30, 1993, now U.S. Pat. No. 5,449,908.

FIELD OF THE INVENTION

This invention generally relates to charge coupled devices (CCDs), and more particularly to infrared sensitive CCDs coupled to a substrate of different material.

BACKGROUND OF THE INVENTION

Heretofore there has been a continual need for higher sensitivities, lower noise, higher resolution and higher speeds in infrared-sensitive charge-coupled devices. An overview of these devices, and of CCDs in general, is discussed in "Imaging Devices Using the Charge-Coupled Concept" by David F. Barbe, *Charge-Coupled Devices: Technology and Applications*, 1977, pp. 130–159.

Narrow bandgap semiconductors, such as mercury-cadmium-telluride (generically denoted as $Hg_{1-x}Cd_xTe$, and herein abbreviated as HgCdTe), are extensively employed as the photosensitive semiconductor in infrared detectors. For example, $Hg_{0.8}Cd_{0.2}Te$ has a bandgap of about 0.1 eV, and a 0.1 eV photon has a wavelength of 12 um; whereas $Hg_{0.73}Cd_{0.27}Te$ has a bandgap of about 0.24 eV, and a 0.24 eV photon has a wavelength of 5 um. These two wavelengths are in two atmospheric windows of great interest for infrared detectors, although other concentrations of HgCdTe useful at other wavelengths are also of interest.

In applications where the image has a velocity relative to the CCD chip, the CCD can be used in the time delay and integration (TDI) mode to enhance the signal-to-noise ratio. In these applications, a CCD is oriented in such a direction and clocked at such a rate that the transfer of charge down the CCD columns is synchronous with the movement of the image along the CCD columns. The noise accumulated during the transfer, e.g. photon shot noise, dark current noise and trapping noise, adds incoherently. The signal-to-noise ratio is improved because the signals add coherently.

SUMMARY OF THE INVENTION

In one prior an approach, infrared imaging incorporating TDI has been attempted utilizing narrow bandgap semiconductor CCDs, such as HgCdTe, along with off-chip charge conversion (typically by means of a source-follower amplifier) and TDI. Generally, parasitic capacitances associated with the required bond pads and interconnect wiring of this method reduced the efficiency with which signal charge was converted to signal voltage. This reduction in efficiency increased the effective noise level of the off-chip amplifier which limited the dynamic range of the CCD, thereby making this approach essentially untenable at the time.

In a more recent prior an approach, monolithic CCDs with TDI capability have been fabricated on a single substrate of HgCdTe. Performing the signal summation in the charge domain provides additional improvement in the signal-to-noise ratio as compared to approaches which perform TDI off-chip. However, these monolithic devices are generally difficult to fabricate because of the material, mechanical and electrical properties of the narrow bandgap substrate. As an example, large-area densely packed arrays with relatively short image frame intervals generally use high speed multiplexing shift registers, which must be made in HgCdTe in the monolithic approach. Also, at least one HgCdTe preamplifier stage, typically a reset-follower amplifier, is generally used per shift register to convert the signal charge to a voltage, and to buffer the readout with the external system circuitry. These high speed sub-circuits are usually the yield- and performance-limiting devices in the detector chip. Transfer of signal charge packets through the multiplexing shift registers at high pixel rates (generally greater than about 500 kHz) generally produces degradation of the detector modulation transfer function (MTF) due to charge transfer inefficiency (CTI). To alleviate this problem, reduction of the serial clock rate can be accomplished through the use of additional preamplifiers. However, the preamplifier stages are generally larger in HgCdTe than comparable devices in silicon. Also, to operate reset-follower amplifiers in a substantially optimum noise condition, specialized HgCdTe metal-insulator-semiconductor field-effect transistor (MISFET) structures with at least six control leads generally must be used, as discussed in "Field-Extended Field-Effect Transistors in 0.25-eV Bandgap HgCdTe" by Mark V. Wadsworth and Roland W. Gooch, *IEEE Transactions on Electron Devices*, vol. 40, no. 3, pp 487–492, March 1993. Thus adding preamplifier stages substantially complicates monolithic infrared CCD design and increases the active area of the device.

In accordance with the present invention, an infrared imaging system generally has enhanced performance and is easier to manufacture if the optically sensitive components are fabricated on an infrared imaging substrate, such as HgCdTe, and the signal processing components are fabricated on a separate signal conditioning substrate, such as silicon. These two substrates can be mechanically and electrically coupled without wires, thus substantially reducing parasitic capacitances. Operations such as time delay and integration for improved signal-to-noise ratios can be performed in the charge domain on the imaging substrate, and high speed functions such as signal amplification and multiplexing can be performed on the signal conditioning substrate. Additional fabrication and performance advantages which result from the various embodiments of this invention are described hereinbelow.

One embodiment of this invention is a hybrid semiconductor imaging structure comprising a signal conditioning substrate, and an imaging substrate mounted on the conditioning substrate. At least two high speed signal processing channels are disposed in the conditioning substrate, and at least two infrared-sensitive time delay and integration CCD columns charge coupled to CCD sense nodes are disposed in the imaging substrate. Low capacitance hybrid leads connect the sense nodes to respective ones of the signal processing channels.

A method of using an embodiment of this invention comprises generating charges in columns of CCDs located on an infrared-sensitive substrate, wherein the charges are proportional to infrared radiation impinging on the CCDs. Time delay and integration of the charges is performed in the CCD columns to provide TDI signals, which are sensed by CCD sense nodes located on the infrared-sensitive substrate. The TDI signals are transferred via low capacitance hybrid leads to high speed preamplifiers located on a separate signal processing substrate. Voltages proportional to the TDI signals are produced by the preamplifiers, and correlated double sampling and high speed multiplexing of the voltages on the signal processing substrate produce a serial image output.

A method of forming an embodiment of this invention comprises the steps of forming a signal conditioning substrate comprising at least two high speed signal processing channels, mounting an infrared-sensitive imaging substrate on the conditioning substrate, forming at least two CCD sense nodes in the imaging substrate, forming a first insulating layer on the imaging substrate, depositing multiphase clocked gates on the insulating layer to form at least two time delay and integration CCD columns in the imaging substrate, wherein each of the columns is charge coupled to one of the CCD sense nodes, and connecting the CCD sense nodes on the imaging substrate to respective ones of the signal processing channels on the conditioning substrate with patterned low capacitance hybrid leads.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF PREFERRED EMBODIMENTS

Figure 1:
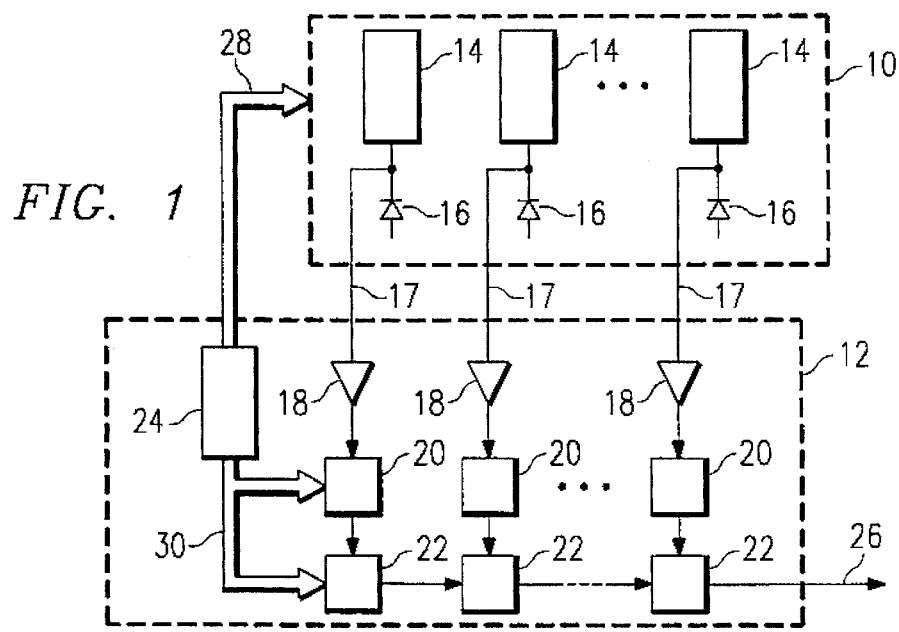
FIG. 1 is a schematic circuit diagram showing the pertinent functions implemented on two substrates of different materials.

In FIG. 1, a schematic of a preferred embodiment is illustrated. An infrared sensitive HgCdTe substrate 10 contains TDI CCD imaging columns 14 which are clocked such that the summed charge of each column is transferred onto respective diodes 16. Diodes 16 are electrically connected to a silicon signal conditioning substrate 12 by low capacitance hybrid thin film leads 17. The silicon substrate 12 contains signal processing channels corresponding to each of the TDI CCD imaging columns 14. Capacitive transimpedance amplifiers (CTIAs)) 18, which provide high gain with low noise, receive image signals from diodes 16 and pass amplified voltage signals to correlated double sampling circuits 20. The correlated double sampling circuits substantially reduce the noise caused by the periodic resetting of the signal voltages from CTIAs 18. Correlated double sampling is described in more detail by David F. Barbe, supra, pp. 138–140. The timing signals for sampling circuits 20 arrive from signal processing clock lines 30 such that samples are taken of the amplified signals from CTIAs 18 relative to internal reference voltages. The outputs of sampling circuits 20 are analog voltages that are coupled to image output 26 by means of multiplexing shift registers 22. The clock generator 24 provides timing signals for the HgCdTe CCD substrate 10 through four phase clock lines 28, and timing signals for the silicon substrate 12 through signal processing clock lines 30.

Some of the advantages of the invention are apparent in this embodiment: (a) no high speed charge transfer is required through the CCD array on HgCdTe substrate 10, (b) high gain, low noise, small sized amplifiers are much easier to design and fabricate in silicon than in HgCdTe, (c) the sampling circuit 20, the multiplexing shift registers 22 and the clock generator 24 are high speed circuits which are much easier to design and fabricate in silicon than in HgCdTe, (d) a more robust mechanical structure able to withstand many thermal cycles results from mounting the delicate HgCdTe substrate 10 on the robust silicon substrate 12, and (e) very high speed serial formatted image output 26 may be derived from the relatively slow parallel signal voltages coming from the HgCdTe imaging substrate 10 via hybrid electrical connections 17.

Figure 2A:
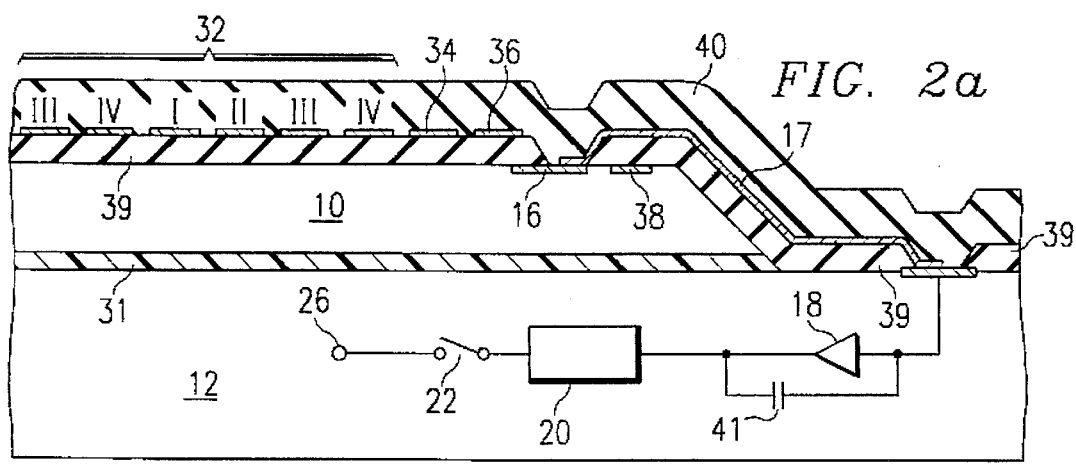
FIG. 2a is a cross section/schematic of some specific elements of a four phase configuration of a TDI CCD hybrid structure.
Figure 2B:
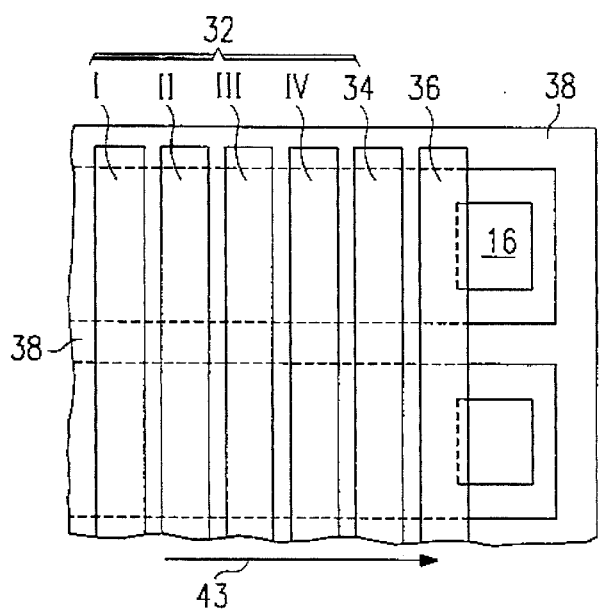
FIG. 2b is a top view of a portion of the TDI CCD hybrid structure.

Another preferred embodiment of the invention is now described in more detail with the aid of FIGS. 2a and 2b. In this embodiment, an HgCdTe CCD substrate 10, here gate side illuminated and with a four phase clock configuration 32, is mounted to a silicon substrate 12 by epoxy layer 31. The timing sequence of the four phase clocked gates 32 is represented by I, II, III and IV, which propagate the TDI charges down the channel toward diode 16. Charge aggregation gate 34 is driven to accumulate the aggregate of these charges which is then transferred by transfer gate 36 to diode 16. CCD gate electrodes 32, 34 and 36 are constructed from a single conducting layer located between ZnS insulating layers 39 and 40. Small gaps (generally 2 um or less) exist between each of the CCD gates. Charge transfer occurs between phases by modulating the gate biases to control the surface potential of the regions between the gate electrodes. Thin film lead 17 is deposited, after etching ZnS layer 39, to electrically connect diode 16 on HgCdTe substrate 10 to CTIA 18 on silicon substrate 12 for further processing of the signal. Channel stop 38, which consists of metal insulatively disposed from substrate 10, isolates each TDI channel to limit charge leakage between channels. CTIA 18 provides an output voltage proportional to the charge on diode 16 but holds the diode 16 at a constant bias voltage. Correlated double sampling circuit 20 and shift register 22 are also fabricated on the silicon substrate 12.

FIG. 2b shows a partial top view of the structure of FIG. 2a, and more clearly indicates the location of channel stop 38. Channel stop 38 can be made from the same material and during the same fabrication steps as those producing contacts to the diodes and substrate. From this view it is also clear that there are no obstructive attenuations to the TDI IR image path 43 such as overlapping gates or opaque metal connections within the imaging region.

Some other significant benefits of the invention are now more apparent. Accomplishing TDI in the charge domain achieves a substantially higher signal-to-noise ratio than off-chip conversion and TDI. The higher speed operations are done in silicon and not in HgCdTe. The removal of the high speed multiplexing from the HgCdTe substrate eliminates the image degradation in the cross-scan direction that is found in prior art monolithic devices due to charge transfer inefficiency. The high speed serial readout is instead performed in silicon and is not subject to such problems.

As another advantage, CTIA 18 minimizes the voltage swing on thin film lead 17 and thereby substantially decreases the effect of parasitic capacitances. The signal charge is integrated on integration capacitor 41 (which has a known value) in CTIA 18. For the relatively slow readout rates of this parallel approach, the output signal level is not significantly affected by the parasitic elements.

Also, the bandwidth requirement of CTIA 18 is substantially reduced compared to a fully monolithic approach. This bandwidth reduction decreases CTIA 18 induced noise and improves the system dynamic range. CTIA 18 also has the desirable effect of allowing substantial reduction of the bias voltage on diode 16 from a typical prior art value of 0.75–1.25 volts down to below about 0.5 volts, preferably below about 0.25 volts, and most preferably below about 0.1 volts. Data taken on 5 um cutoff IR wavelength HgCdTe diodes indicates that the 1/f noise component does not become significant until the bias voltage is brought above about 0.5 volts. Thus the CTIA can substantially lower diode-induced 1/f noise levels. Also, a minimal number of metal depositions are used during the fabrication process for forming the substrate contacts, channel stops, gate electrodes and interconnects, thus substantially reducing the number of fabrications steps thereby increasing yields and decreasing costs.

Figure 3:
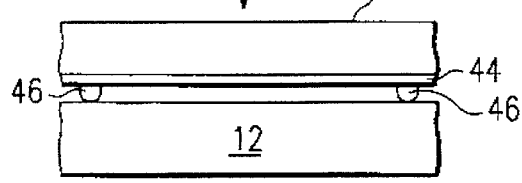
FIG. 3 is a side view of a bump bonded configuration.

Another preferred embodiment is illustrated in FIG. 3. In this case, the infrared imaging substrate consists of an epitaxial layer 20–30 micrometers thick of HgCdTe 44 on cadmium-telluride (CdTe) 48. The infrared imaging substrate is flip-chip mounted electrically and mechanically to the silicon substrate 12 by indium bump bonds 46. CdTe 48 is transparent to IR illumination 42 which results in high quantum conversion efficiency. This embodiment comprises a backside illuminated hybrid TDI CCD imaging system which retains the previously described advantages and provides even lower parasitic capacitances. An additional advantage of this approach is the ability to use highly conductive opaque metal for the gate electrodes, thus improving manufacturability.

Figure 4:
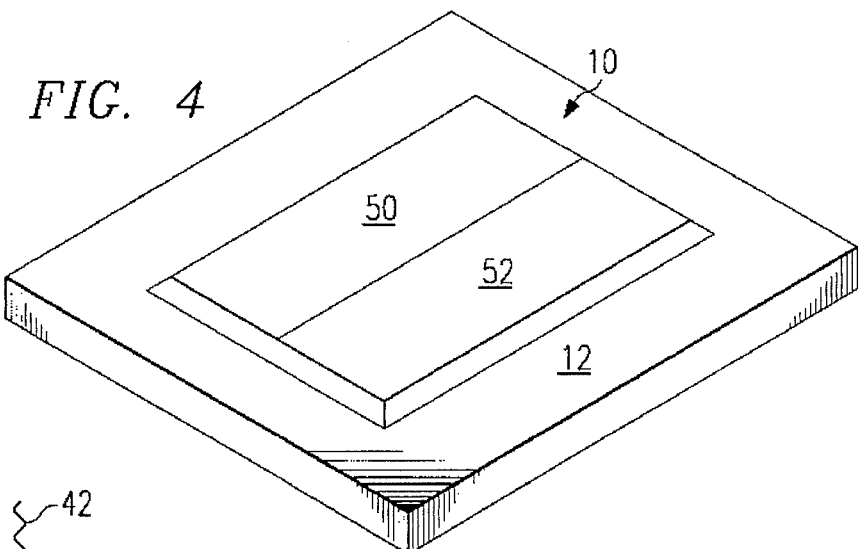
FIG. 4 is a perspective of a two wavelength IR detection configuration.

Yet another preferred embodiment is depicted in FIG. 4. This hybrid configuration provides for the detection of two different wavelengths of IR. The HgCdTe substrate 10 is processed such that CCD array 50 is sensitive to short wavelength IR and CCD array 52 is sensitive to medium wavelength IR. Silicon substrate 12 is used to process the data from both wavelengths, as described hereinabove.

Figure 5:
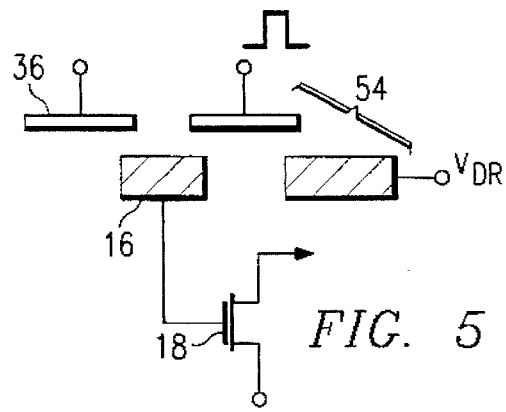
FIG. 5 is a schematic diagram of a reset-follower CCD output circuit utilizing a low capacitance hybrid lead.
Figure 7:
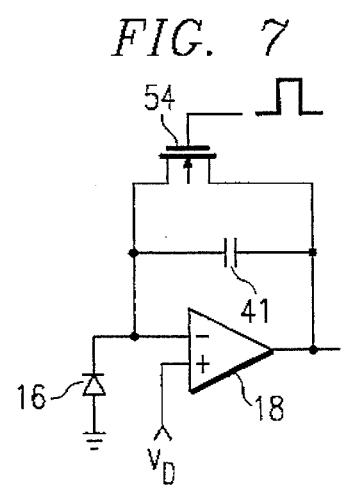
FIG. 7 is a schematic diagram of a capacitive transimpedance amplifier CCD output circuit utilizing a low capacitance hybrid lead.
Figure 6:
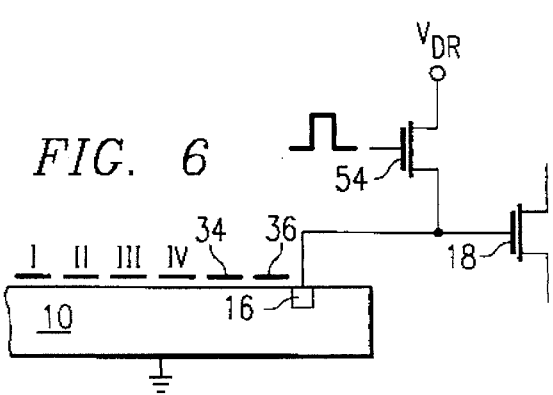
FIG. 6 is a cross section/schematic of a reset-follower CCD output circuit utilizing a low capacitance hybrid lead.
Figure 8:
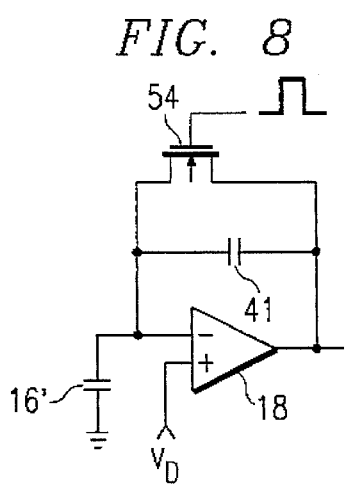
FIG. 8 is a schematic diagram of an alternate reset-follower CCD output circuit embodiment utilizing low capacitance hybrid leads.

FIGS. 5–7 illustrate some of the various output circuits for CCDs; other examples are described in "Charge-Coupled Devices—An Overview" by Walter F. Kosonocky, 1974 *Western Electron. Show and Conv. Tech. Papers*, vol. 18, pp. 2/1–2/20, Sep. 10–13, 1974. Many configurations are possible. For example, preamplifiers can be reset-followers or charge integrators, and can be formed in either HgCdTe or in silicon. If a silicon reset-follower is used, then diode 16 performs charge-to-voltage conversion since the diode acts as a capacitive element. If a silicon charge integrator is used, then diode 16 is merely an interconnect mechanism for transferring the charge out of the CCD and into the input of the integrator.

FIG. 5 depicts a floating diffusion amplifier configuration in which the effects of long-term drift are reduced by periodically resetting diode 16 to a reference potential $V_{DR}$ via reset switch 54. In conjunction, correlated double sampling substantially reduces the noise caused by the periodic resetting. Diode 16 is in turn connected to the gate of amplifier 18, which can be either an inverter or a source-follower. If amplifier 18 is a source-follower, then this configuration can also be referred to as a reset-follower. The detected signal is proportional to the variation of the diode 16 voltage as a function of the charge signal. FIG. 6 depicts another representation of a reset-follower output circuit configuration for a CCD. In FIG. 6, diode 16 is reset to a reverse-bias voltage $V_{DR}$ through MOSFET reset switch 54.

An example of an integrating amplifier is illustrated in FIG. 7. This is also referred to as a capacitive transimpedance amplifier since input current from diode 16 is convened to voltage and integrated by feedback capacitor 41. MOSFET reset switch 54 is used to reset the integrator periodically (e.g. once per pixel read interval) to substantially reduce the effect of long-term drift. Operational amplifier 18 forces dime 16 to be held at voltage $V_D$ which is applied to the non-inverting input of amplifier 18 (virtual ground concept). "The Art of Electronics" by Paul Horowitz and Winfield Hill, pp. 121–122, Cambridge University Press, New York, 1980, provides further details on integrating amplifiers. The sole table, below, provides an overview of some embodiments and the drawing.

TABLE

| Drawing Element | Preferred or Specific Examples | Generic term/ Function | Other Alternate Examples |
| --- | --- | --- | --- |
| 10 | Gate-side illuminated HgCdTe | CCD infrared imaging substrate/provide infrared sensitive CCD array | Back-side illuminated array Epitaxial HgCdTe on CdTe |
| 2 | Si | Signal conditioning substrate/provide high speed digital and analog circuits | Other semiconductor materials (e.g. GaAs, Ge, SiC) |
| 14 | | TDI CCD imaging column/convert IR illumination to electrical charge | |
| 16, 16' | Diode | CCD sense node (CCD sense element)/ detect and transfer image signal to signal conditioning substrate | Capacitor |
| 17 | Aluminum thin-film lead | Hybrid lead/provide low capacitance electrical connection for transfer of image signal from CCDs to signal conditioning circuits | Other low resistance semiconductor materials (e.g. Ta, Ti, W, doped polysilicon) Combinations of above-mentioned materials Flip-chip bump bonds, vias in Elements 10 and/ or 12 |
| 18 | Capacitive transimpedance amplifier | Preamplifier/receive image signal from CCD infrared imaging array, provide voltage gain | Charge integrating amplifier Reset-follower amplifier |
| 20 | | Correlated double sampling circuit/ provide synchronous difference between signal and reference magnitudes | |
| 22 | Shift register | Signal multiplex switch/converts parallel inputs to desired serial format | |
| 24 | | Clock Generator/ provide multiphase clock for CCD and synchronized signal processing clocks | |
| 26 | | Image output/provide | |

TABLE-continued

| Drawing Element | Preferred or Specific Examples | Generic term/ Function | Other Alternate Examples |
|---|---|---|---|
| | | serial stream of output voltages corresponding to image signal levels | |
| 28 | 4 phase clock lines | Multiphase clock lines/synchronize unidirectional charge transfer | 3 phase clock lines, 5 (or more) phase clock lines |
| 30 | | Signal processing clock lines/synchronize digital signal processing circuits with CCD | |
| 31 | Epoxy | Adhesive layer | Other semiconductor adhesive materials (e.g. glass, polyimide) |
| 32 | Gapped, 4 phase clocked gates | Multiphase clocked gates/provide IR transparency, and unidirectional CCD charge transfer | 3 phase clock gates, 5 (or more) phase clocked gates Overlapping gates |
| 34 | | Charge aggregation gate/accumulate TDI charge | |
| 36 | | Charge transfer gate/ synchronously transfer charge to sense node | |
| 38 | Tin | Channel stop/inhibit charge leakage from channel | Materials listed in Element 17 above |
| 39 | ZnS | First insulating layer/ isolate conductors | Si$_3$N$_4$, CdTe |
| 40 | ZnS | Second insulating layer/isolate conductors | Si$_3$N$_4$, CdTe |
| 41 | | Integration capacitor/ used with CTIA for charge integration | |
| 42 | | IR illumination | |
| 43 | | IR image path | |
| 44 | HgCdTe | Epitaxial layer/ provide IR sensitive material | |
| 46 | Indium | Flip chip bump bond/ provide electrical and mechanical connection between CCDs and signal conditioning substrate | |
| 48 | CdTe | Supporting substrate/ provide IR transparency, and support for epitaxial layer | |
| 50 | Short IR wavelength sensitive array | First IR wavelength sensitive CCD array | Long IR wavelength sensitive array |
| 52 | Medium IR wavelength sensitive array | Second IR wavelength sensitive CCD array | Long IR wavelength sensitive array |
| 54 | | Reset switch/set voltage to reference level | |

A few preferred embodiments have been described in detail herein. It is to be understood that the scope of the invention also comprehends embodiments different than those described, yet within the scope of the claims. For example, a capacitor 16' may be used in place of diode 16 as the sense element. Diode 16 may convert incoming charge to voltage when amplifier 18 is a reset-follower. Conversely, if amplifier 18 is a charge integrator, then diode 16 transfers the charge from the CCD to the amplifier for integration. As another example, the signal conditioning substrate has been referred to as made of silicon; at cryogenic temperatures this material might be germanium, and at very high temperatures gallium-arsenide or silicon-carbide might be desirable. An alternative to thin film leads 17 are vertical vias through HgCdTe substrate 10. The example of FIG. 4 for imaging at two different wavelengths may have the imaging substrate connected to the silicon substrate with either bump bonds or via type contacts. Overlapping gates may be used instead of non-overlapping gates.

Internal and external electrical connections can be ohmic or capacitive, direct or indirect, via intervening circuits or otherwise. Implementation is contemplated in discrete components or fully integrated circuits in HgCdTe or other narrow bandgap electronic materials families, as well as in other technology-based forms and embodiments. In general the preferred or specific examples are preferred over the other alternate examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A hybrid semiconductor imaging structure, said structure comprising:
   a. a first substrate;
   b. at least two high speed signal processing channels disposed in said first substrate;
   c. a second substrate mounted on said first substrate;
   d. at least two infrared-sensitive time delay and integration CCD columns disposed in said second substrate;
   e. at least two CCD sense elements disposed in said second substrate and charge coupled to respective CCD columns; and
   f. low capacitance hybrid leads connecting said sense elements to respective signal processing channels.

2. The structure of claim 1, wherein said sense elements are diodes.

3. The structure of claim 1, wherein said sense elements are capacitors.

4. The structure of claim 1, wherein each of said signal processing channels comprise:
   a preamplifier having an amplifier input and an amplifier output, wherein said amplifier input is electrically connected to one of said hybrid leads;
   a correlated double sampling circuit having a sampling input and a sampled output, wherein said sampling input is electrically connected to said amplifier output; and
   a multiplex switch electrically connected to said sampled output.

5. The structure of claim 1, wherein each of said signal processing channels comprise a capacitive transimpedance amplifier electrically connected to one of said hybrid leads, and wherein said sense elements are diodes; wherein a bias voltage of less than 0.5 volts is applied across at least one said diode.

6. The structure of claim 1, wherein said signal processing channels comprise a reset-follower amplifier electrically connected to one of said hybrid leads.

7. The structure of claim 1, wherein said hybrid leads are thin film leads.

8. The structure of claim 1, wherein said hybrid leads are via connections.

9. The structure of claim 1, wherein said hybrid leads are bump bonds.

10. The structure of claim 9, wherein said hybrid leads comprise indium.

11. The structure of claim 9, wherein said second substrate is back-side illuminated.

12. The structure of claim 1, wherein said hybrid leads are selected from the group consisting of: aluminum, tantalum, titanium, tungsten, doped polysilicon, and combinations thereof.

13. The structure of claim 1, wherein said second substrate is mounted to said first substrate with a material selected from the group consisting of: epoxy, glass, and polyimide.

14. The structure of claim 1, said second substrate is formed from narrow-bandgap semiconductor material.

15. The structure of claim 14, wherein said material is HgCdTe.

16. The structure of claim 1, wherein said first substrate comprises silicon.

17. The structure of claim 1, wherein said second substrate is gate side illuminated.

18. The structure of claim 1, wherein said second substrate is sensitive to two infrared wavelength regions.

* * * * *